United States Patent [19]

Reid

[11] Patent Number: 4,815,596
[45] Date of Patent: Mar. 28, 1989

[54] DIP CARRIER

[75] Inventor: Steven J. Reid, Austin, Tex.

[73] Assignee: Minnesota Mining and Manufacturing Company, St. Paul, Minn.

[21] Appl. No.: 152,046

[22] Filed: Feb. 4, 1988

[51] Int. Cl.⁴ .............................................. B65D 85/42
[52] U.S. Cl. .................................... 206/334; 206/328; 206/520; 361/220
[58] Field of Search ............... 206/328, 331, 332, 334, 206/583, 820; 361/212, 220

[56] References Cited

U.S. PATENT DOCUMENTS 3,353,656  11/1967  Brown ................................. 206/328
4,564,880  1/1986   Christ et al. ......................... 361/220
4,585,121  4/1986   Capelle, Jr. ......................... 206/583
4,585,122  4/1986   Stegenga ............................. 206/334
4,593,339  1/1986   Robinson ............................ 361/220

OTHER PUBLICATIONS

Technical Digest No. 30, Apr. 1973, "Integrated Circuit Shipping Package", Egan et al.
IBM Technical Disclosure Bulletin, Module Substrate Case, Jun. 1981, Avazian et al.

Primary Examiner—David T. Fidei
Attorney, Agent, or Firm—Donald M. Sell; John C. Barnes

[57] ABSTRACT

A single dual in-line package integrated circuit component carrier adapted to provide mechanical and static shielding protection is box like with spaced pairs of walls to minimize the size of the carrier but accommodate the 300, 400 or 600 mil DIP component.

7 Claims, 2 Drawing Sheets

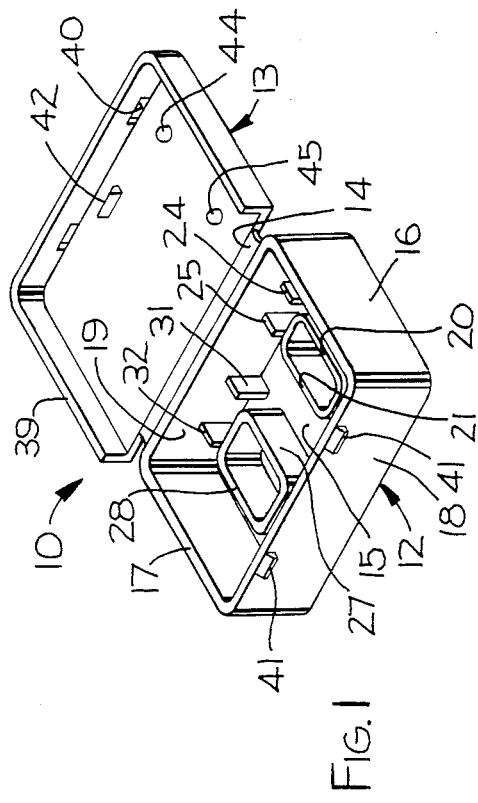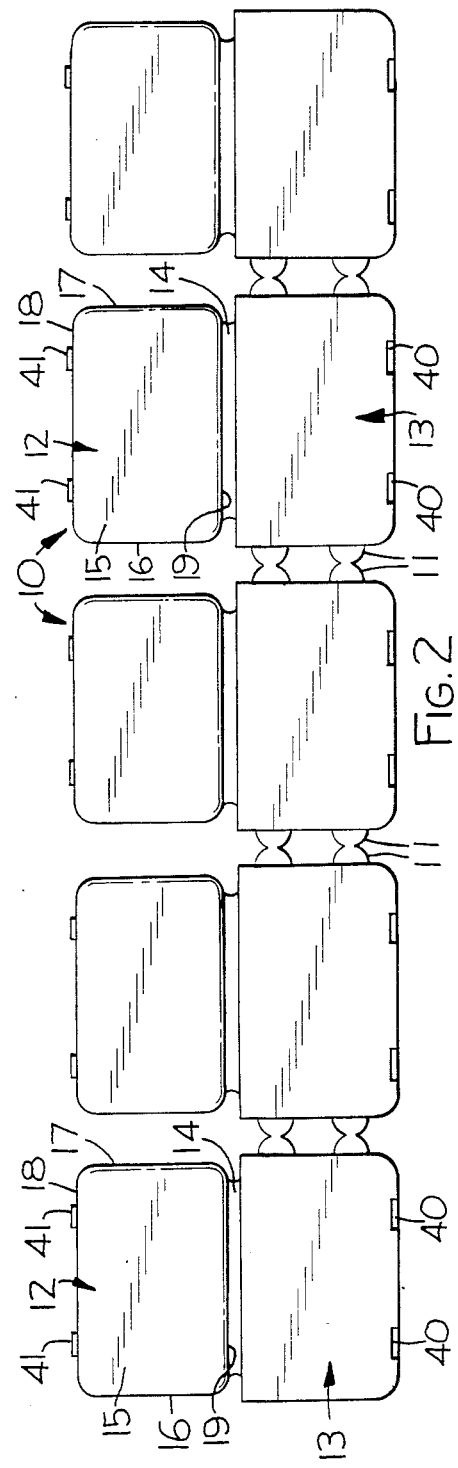

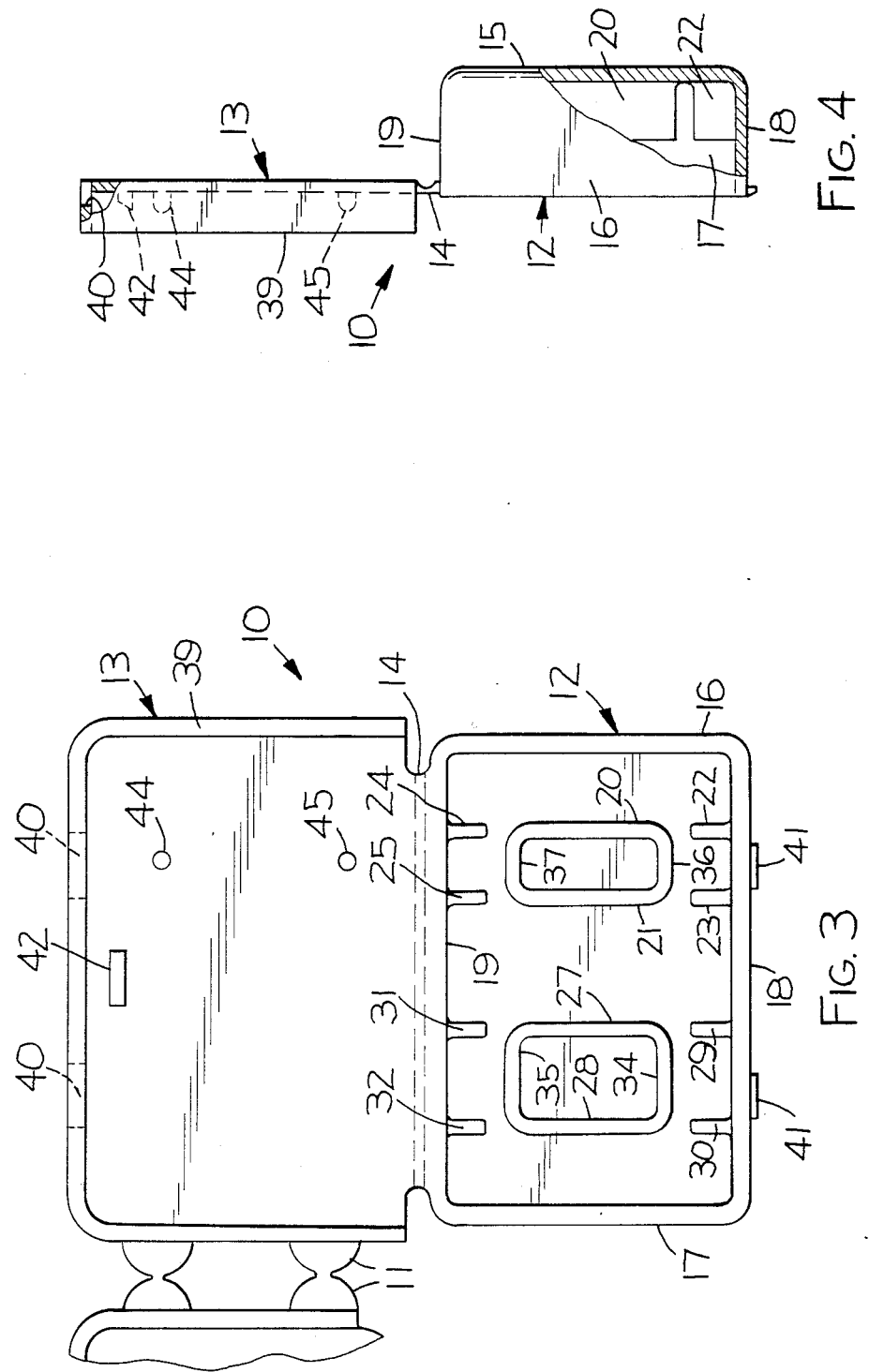

DIP CARRIER

BACKGROUND OF THE INVENTION

1. Field of the Invention

This invention relates to an improved carrier which provides both mechanical and static shielding protection for dual in-line package (DIP) integrated circuit components or devices and in one aspect to a carrier to accommodate a single 300, 400 or 600 mil DIP.

2. Description of the Prior Art

The integrated circuit devices must be shipped from the manufacturer to the user; and at the user's plant, the integrated circuit devices are stored for use and supplied as needed. Since the integrated circuit devices comprise pins which extend from the sides of the devices for attachment to printed circuit boards, it is advantageous that such pins not be bent or displaced. The pins are generally formed to extend from parallel sides; and when extending from just two sides, the components are referred to as dual inline package (DIP) integrated circuit components or devices. The spacing between the pins is measured in thousandth of an inch or mils and the DIP components are thus identified as the 300, 400, and 600, etc. mil DIP.

Prior to this invention individual DIP components were shipped on foam carriers, offering limited mechanical protection, in shielded bags offering no mechanical protection, or in blister packaging which offered both mechanical and static shielding protection but at a high unit cost.

The foam carriers and bags offered a universal package for all of the popular sizes of components but they are bulky and not entirely satisfactory. They do not offer the desired degree of mechanical and static shielding protection to protect the integrated circuit and to protect the pins from undesirable displacement. The existing blister packages do not afford universal packaging and inventory of sizes and the cost make them undesirable.

SUMMARY OF THE INVENTION

The carrier of the present invention comprises a box-like shell and cover which are hinged together. The shell comprises a rectangular bottom wall and side walls forming a receptacle. Projecting from the bottom wall and into the shell are spaced walls adapted to fit between the dual rows of pins on the DIP integrated circuit components. The walls in the carrier of the present invention are so spaced to support a single 300, 400 or 600 mil DIP to offer mechanical and static shielding protection. The cover is then placed over the shell to enclose the component.

The shell is provided with two pair of parallel wall members spaced to receive the 300 and 400 mil DIP thereon. A third pair of spaced wall members, positioned perpendicular to the first mentioned two pair of parallel wall members are space to receive thereon a 600 mil DIP.

BRIEF DESCRIPTION OF THE DRAWING

The present invention will be more fully described with reference to the accompanying drawing wherein:

FIG. 1 is a perspective view of the present invention;

FIG. 2 is a bottom plan view of a series of carriers formed according to the present invention;

FIG. 3 is a top plan view of a carrier according to the present invention; and

FIG. 4 is an end view of a carrier, partly in section to show interior details.

DETAILED DESCRIPTION OF THE PREFERRED EMBODIMENT

Referring to the accompanying drawing there is illustrated a single component carrier generally designated 10 which is preferably formed in a chain of such devices as shown in FIG. 2.

The carriers 10 are joined by frangible tabs or webs 11 of a semicircular shape joined tangentially to a similar tab 11 on a second carrier. The tabs 11 have a reduced thickness where they meet a tab from an adjacent, second carrier and are thus easily cut or broken along the tangential edge.

The carrier 10 comprises a box-like shell 12 and a cover 13. The cover 13 is joined along one edge to one side wall of the shell 12 by an integral hinge defined by a reduced thickness molded web 14.

The carrier 10 is molded from an electrically conductive polymeric composition preferably a conductive polyolefin having a volume resistivity of less than $10^5$ ohm cms. A suitable composition is preferably fabricated from a polyallylomer loaded with carbon particles the latter rendering the material conductive. To provide the material with adequate electrically conductive characteristics, conductive carbon particles in the range of 10–40% by weight were added to the polyallylomer. The preferred percentage of carbon particles was found to be about 25%.

An electrically conductive material having a volume resistivity above $10^5$ ohm cm and below $10^9$ ohm cm is not currently known which is readily usable in injection molding equipment. The use of such electrically conductive material is sufficient to afford static shielding for some components. Therefore, such material, i.e., static dissipative materials are considered suitable for use in the present inventions. The electrically conductive material provides shielding to restrict deleterious to the component problems caused by static electricity.

The shell 12 comprises a rectangular bottom wall 15 and four side walls comprising opposed end walls 16 and 17, a front wall 18 and back wall 19. Projecting into the shell 12 from the bottom wall are spaced walls adapted to fit between the rows of pins on a dual in-line package (DIP) integrated circuit (IC) component. These walls are of sufficient height to hold the pins slightly spaced from the bottom wall and they are shorter than the side walls 16–19 to afford space for the body of the IC component in the shell 12 below the cover 13. A preferred height for the walls is 0.21 inch (0.53 cm).

Referring now to FIG. 3, the position of the walls for supporting the components mechanically will be described. A first pair of walls are spaced such that the outside surfaces are separated by 0.280 inch (0.71 cm) to receive thereover a 300 mil DIP. The first pair of walls comprises two parallel walls 20 and 21 positioned perpendicular to and spaced generally symmetrically between the front 18 and back wall 19. Additional wall segments 22, 23, 24, and 25 are aligned with the walls 20 and 21 and are spaced from said two walls and project from the bottom wall 15 and are joined to said front and back wall as illustrated.

A second pair of walls are spaced such that the outside surfaces are separated by 0.380 inch (0.97 cm) to fit between the pins of a 400 mil DIP. The second pair of walls comprises two parallel spaced walls 27 and 28 positioned perpendicular to and spaced generally symmetrically between the front 18 and back wall 19. Additional wall segments 29, 30, 31, and 32 are aligned with the walls 27 and 28 and are spaced therefrom. The wall segments 29–32 are joined to the front and back wall and project from the bottom wall 15.

A third pair of spaced parallel walls are formed to receive a 600 mil DIP. These walls are separated by 0.580 inch (1.5 cm). The third pair of walls comprise two parallel walls 34 and 35 which are joined to the ends of the walls 27 and 28. The outside surfaces of these walls 34 and 35 support the 600 mil DIP. The third pair further comprises additional wall segments 36 and 37, which are aligned with the walls 34 and 35 and joined to the ends of the walls 20 and 21. The spacing between the walls 34 and 36 and the ends of walls 22, 23, 29, and 30 are sufficient to receive the pins of a DIP component, e.g., 0.13 inch (0.33 cm) and the same is true for the spacing between the walls 35 and 37 and wall segments 24, 25, 31, and 32.

The overall length of the carrier is preferably 1.65 inch (4.2 cm) and the width of the shell 12 preferably does not exceed 1.1 inch (2.8 cm).

Thus a single IC component of one of the sizes 300, 400, 600 mil DIP can be placed in the same carrier 10 and there is no need to stock three different sizes of IC carriers.

As shown in the drawing, the cover 13 is hinged along the top edge of the back wall 19. The cover 13 has a rectangular top and downwardly depending edge walls 39 to enclose the shell. Two openings or recesses 40 are formed at the juncture of the top and front edge wall to receive two detents 41 formed on the front outer edge of the front wall 18 to reasonably secure the cover to the shell and enclose a DIP component within the shell atop a pair of walls. A protrusion 42 is formed on the cover 13 and is spaced from the edge wall 39 a distance to receive the front wall 18 therebetween. Spaced bosses 44 and 45 are formed on the cover 13 to engage the body of a 0.300 mil DIP to retain the same, but the bosses are spaced sufficiently to be placed on opposite sides of a 600 mil DIP when placed over the walls 34, 35, 36, and 37.

Having thus disclosed the invention with reference to the preferred embodiment, it will be understood that changes may be made without departing from the spirit or scope of the invention as defined in the appended claims.

I claim:

1. A static shielding carrier affording mechanical support for a dual in-line packaged integrated circuit device, said carrier comprising a box-like shell formed of electrically conductive polymeric material having a bottom wall of rectangular shape, side walls, and a cover;

hinge means joining said cover to one of said side walls; and wall means projecting from said bottom wall for supporting a single dual in-line packaged integrated circuit device of 300 mils and 400 mils and alternatively a single dual in-line packaged integrated circuit device of 600 mils.

2. A one-piece box-like carrier affording mechanical support and static shielding for one of a plurality of varying sized dual in-line package integrated circuit devices, said carrier comprising a box-like shell formed of electrically conductive polymeric material having a bottom wall, side walls projecting from said bottom wall, a cover, and hinge means for joining said cover and shell; and wall means projecting from said bottom wall for supporting a said dual in-line package integrated circuit device by a pair of said wall means fitting between the two rows of contacts of a said dual in-line package integrated circuit device, said wall means comprising a first pair of parallel walls having surfaces spaced 0.28 inch, a second pair of parallel walls having surfaces spaced 0.38 inch and at least one third pair of parallel walls positioned perpendicular to said first and second pairs of walls having surfaces spaced 0.58 inch.

3. A carrier according to claim 2 wherein each said pair of walls comprises spaced aligned wall segments.

4. A carrier according to claim 2 wherein said cover is joined along an edge perpendicular to said hinge means by frangible tabs to an adjacent cover of a second carrier.

5. A carrier according to claim 2 wherein said first pair of parallel walls comprises two walls having a length of 0.58 inch positioned generally centrally of the shell and aligned wall segments extending from opposite side walls toward said two walls;

said second pair of walls comprises two walls 0.58 inch in length parallel to and spaced from said two walls of said first pair and aligned wall segments extending from said opposite side walls; and said third pair of walls comprises aligned wall segments joined to the ends of said two walls of said first pair and the ends of said two walls of said second pair.

6. A carrier according to claim 5 wherein said cover is joined along an edge perpendicular to said hinge means by frangible tabs to an adjacent cover of a second carrier.

7. A carrier according to claim 2 wherein said overall length of said shell parallel to said third pair of walls being not less than 1.65 inch and the width of said shell being at least 1.1 inch.

* * * * *